United States Patent [19]
Baiocchi et al.

[11] Patent Number: 5,168,181
[45] Date of Patent: Dec. 1, 1992

[54] SPIKE FILTERING CIRCUIT FOR LOGIC SIGNALS

[75] Inventors: Antonella Baiocchi, Vigevano; Angelo Alzati, Bollate; Aldo Novelli, San Lorenzo di Parabiago, all of Italy

[73] Assignee: SGS-Thomson Microelectronics s.r.l., Milan, Italy

[21] Appl. No.: 705,006

[22] Filed: May 23, 1991

[30] Foreign Application Priority Data

May 25, 1990 [IT] Italy .................. 83622 A/90

[51] Int. Cl.⁵ .................. H03B 1/04; H04B 1/10
[52] U.S. Cl. .................. 307/520; 307/542; 307/548; 307/592; 307/596; 307/272.1; 307/272.2
[58] Field of Search .......... 307/443, 542, 542.1, 307/546, 548, 520, 550, 592, 596, 521, 603, 234, 272.1, 272.2

[56] References Cited

U.S. PATENT DOCUMENTS

| | | | |
|---|---|---|---|
| 3,812,384 | 5/1974 | Skorup | 307/272.2 |
| 3,925,682 | 12/1975 | Hamada | 307/542.1 |
| 4,138,613 | 2/1979 | Tanaka | 307/247 A |
| 4,470,017 | 9/1984 | Eder | 307/542 |
| 4,604,756 | 8/1986 | Moustakas et al. | 307/595 |
| 4,713,564 | 12/1987 | Kimball et al. | 307/268 |
| 4,785,200 | 11/1988 | Huntington | 307/279 |
| 4,795,915 | 1/1989 | Sun et al. | 307/234 |
| 4,816,702 | 3/1989 | Salina et al. | 307/279 |
| 4,883,993 | 11/1989 | Confalonieri et al. | 307/542.1 |
| 5,059,823 | 10/1991 | Ahsanullah | 307/443 |
| 5,081,377 | 1/1992 | Freyman | 307/443 |

FOREIGN PATENT DOCUMENTS

| | | |
|---|---|---|
| 0320711A2 | 6/1989 | European Pat. Off. . |
| 0102927 | 8/1980 | Japan .................. 307/542.1 |
| 0138331 | 10/1981 | Japan .................. 307/542.1 |
| 0097219 | 6/1982 | Japan .................. 307/542.1 |

OTHER PUBLICATIONS

Peterson; IBM Tech. Disc. Bult.; Jan. 1971; "Contact Bounce Integrator"; p. 2188.
Sedra et al; MicroElectronics; 1982; pp. 223-225, 340 and 341.

Primary Examiner—Janice A. Howell
Assistant Examiner—Terry D. Cunningham
Attorney, Agent, or Firm—Seed and Berry

[57] ABSTRACT

A spike filtering circuit for a logic signal comprises a signal transfer circuit formed by a first transfer gate followed by a pair of inverters, functionally connected in series between the input terminal and the output terminal of the circuit and a second transfer gate connected between the output terminal and the input node of the first of said two inverters. The two transfer gates are driven in phase opposition to each other by means of a pair of control signals in phase opposition to each other which are generated by a control circuit functioning in a feedback mode. Basically the control circuit is formed by an exclusive-OR gate having two inputs connected to the output terminal of the circuit directly and through a delay network, respectively. Through an output node of the exclusive-OR gate is produced a first control signal from which the pair of control signals in phase opposition to each other are derived by means of inverting stages. The delay network introduces a delay after a transition of the signal on the output terminal of the circuit has occurred during which said first transfer gate is momentarily disabled and said second transfer gate is enabled in order to maintain on the output terminal the state reached with the first transition for a period of time sufficiently long to allow the decay of spikes which may be been generated by said transition of the logic signal. By employing a NAND gate and an inverter connected in cascade to the output of said exclusive-OR gate, the filtering circuit may be initialled by applying an enabling signal to a second input of said NAND gate.

21 Claims, 1 Drawing Sheet

SPIKE FILTERING CIRCUIT FOR LOGIC SIGNALS

1. Field of the Invention

The present invention relates to a circuit for filtering spikes from a logic signal generated by the switching of the logic signal from a logic level to another.

2. Description of the Prior Art

Within integrated circuits having logic circuitry or in circuits operating in a switching (on/off) mode, it is important to make the system immune from spikes and/or spurious oscillations occurring when a logic signal changes states between two logic levels. Otherwise, these spikes and/or spurious oscillations can be treated by the logic circuitry as multiple transitions of the input signal thereby resulting in improper operation of the logic circuitry. On the other hand, especially in power circuits having logic circuitry, the switchings are often accompanied by fast chargings and dischargings of reactances and therefore by the generation of spikes.

Several solutions are known for avoiding the undesired effects of these spikes, basically resting upon the creation of a "masking time" for the spikes, that is of a preestablished period of time following each switching during which the system is made temporarily insensitive to the input signal (containing spikes).

These known "filtering" circuits generally utilize SET-RESET type flip-flops or similar devices, wherein a certain input terminal is sensitive to one only of the two possible switching transitions (i.e., from low-to-high level or viceversa) so that after a transition has occurred, the output terminal state may change only through an enabling intervention through a different input terminal to which a suitable clock signal may be fed. In general, it is necessary to use a complex combination of flip-flops and delay blocks for solving the problem. Also, with these prior art circuits synchronization of the clock signals is critical because an erroneous implementation may lead not only to missing the expected result, but to a nonrecoverable latching condition of the system.

Known spike filtering circuits are rather complex and the trimming thereof is critical.

SUMMARY OF THE INVENTION

It has been found now that the filtering of spikes which may be present in a logic signal as a consequence of transitions of the signal from a level to another level may be effectively performed by means of a filtering circuit far simpler than the known circuits and employing a limited number of components while being practically immune from unrecoverable latching phenomena. The improved filtering circuit is inherently fast because it employs a limited number of logic gates and the trimming thereof does not have any substantially critical aspect as compared to the known circuits.

The filtering circuit of the invention comprises a signal transfer circuit that connects an output terminal to the input terminal of the filter circuit. A transition detector senses when the logic level of the output signal from the filter circuit changes state. The transition detector then opens the transfer circuit for a predetermined period so that spikes on the input signal cannot reach the output terminal of the filter circuit. At the same time, the transition detector also maintains the output terminal at the logic level it was in after the detected transition for the predetermined period. The predetermined period has a duration that is sufficiently long to allow decay of the spikes occurring after the detected transition. After the expiration of the predetermined period, the transfer circuit once again connects the output terminal to the input terminal. In one embodiment of the invention, the transfer circuit is formed by a first transfer gate driven by a first control signal and an inverted replica signal thereof, operatively connected between an input terminal of the filtering circuit and the input node of a first of two inverters connected in cascade. The output of the second inverter is connected to an output terminal of the filtering circuit. A second transfer gate driven in phase opposition to the first transfer gate by the same pair of control signals is operatively connected between the output terminal of the circuit and the input node of the first of said two inverters connected in cascade.

The pair of control signals for the two transfer gates is generated by a control circuit, functioning in a feedback mode, which advantageously may be initialled by an enabling signal for generating said pair of control signals.

These control signals are characterized by having a first transition which coincides with the switching of the logic signal from one logic level to another logic level, and by a second transition of opposition direction in respect to the first transition, occurring after a preestablished delay after the first transition. The delay is sufficiently long to ensure that the switching spikes on the logic signal have decayed. The control signal and the respective inverted replica signal thereof enable the first transfer gate until a transition has occurred on the output terminal of the circuit. This latter event disables the first transfer gate and enables the second transfer gate in order to maintain on the output terminal the level reached after the preceding switching for such a preestablished delay time. At the end of the preestablished delay time, the pair of control signals switch and enable again the first transfer gate and disable the second transfer gate until another switching of the logic signal occurs.

BRIEF DESCRIPTION OF THE DRAWINGS

The different aspects and advantages of the circuit of the invention will be more evident through the following description of a preferred embodiment and by reference to the attached drawings, wherein.

DESCRIPTION OF THE PREFERRED EMBODIMENT

Figure 1:
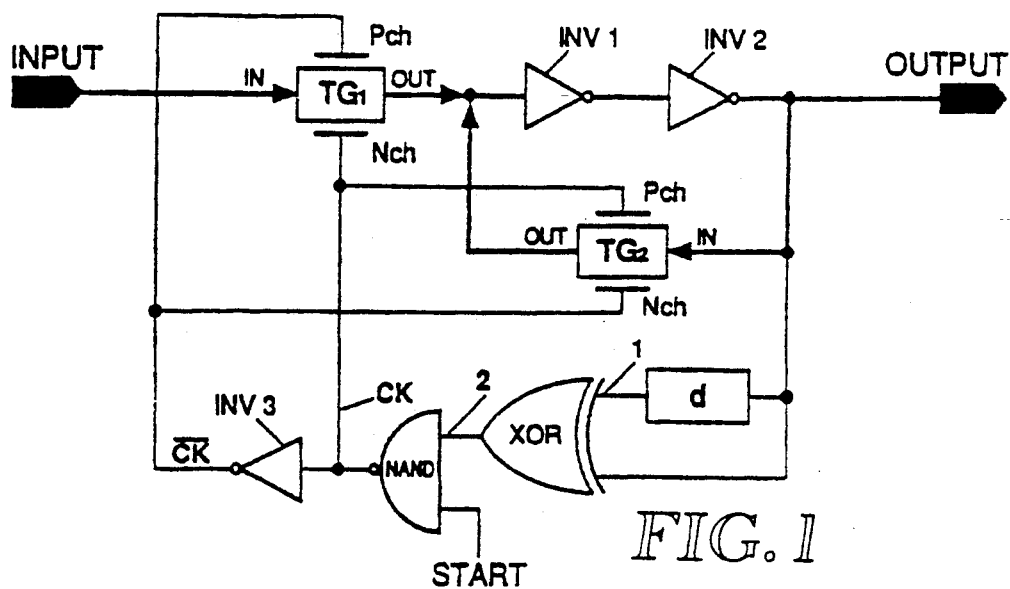
FIG. 1 is a logic diagram of one embodiment of the filtering circuit of the invention.

With reference to the circuit depicted in FIG. 1, the logic signal to be filtered is fed to the input terminal (INPUT) of the filtering circuit and a replica signal, free of spikes which may have been generated as a consequence of a transition (switching) of the logic signal from a level to another level, is delivered through the output terminal (OUTPUT) of the circuit. The transfer path of the logic signal is evidenced in the figure by using a thick line for wirings. The transfer path of the logic signal through the filtering circuit comprises a first transfer gate TG1 which functionally connected between the input terminal and an intermediate input node of the first two inverters, INV1 and INV2 which are, connected in cascade between said intermediate node and the output terminal of the circuit and a second transfer gate TG2, which is connected between the output terminal of the circuit and the same intermediate input node.

The transfer gates are familiar devices for one skilled in the art, which commonly are formed by a pair of complementary transistors, typically a p-channel and an n-channel transistor, functionally connected in parallel between a common input node and a common output node. The two transistors are driven through their respective control terminals by a pair of control signals, one of which is the inverted replica of the other. For a certain logic state of the pair of control signals, the transfer gate represents a closed switch while by inverting the state of the pair of control signals, the transfer gate behaves as an open switch.

The control circuit for generating said pair of control signals includes a transition detector comprising essentially a delay network d and an exclusive-OR gate XOR and most preferably also a NAND gate and an inverter INV3, as depicted in FIG. 1.

Figure 2:
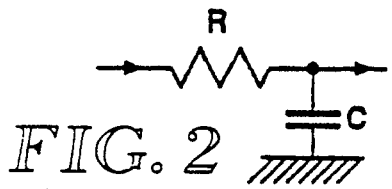
FIG. 2 is a schematic of a delay network used in the circuit of FIG. 1.
Figure 3:
FIG. 3 is a logic diagram of an alternative form of the delay network used in the circuit of FIG. 1.

The delay network d may be realized with any suitable circuit means. In FIG. 2 an embodiment utilizing a common RC network is shown, while in FIG. 3 and alternative form of the delay network is shown, wherein a chain of inverters, connected in cascade, is used for determining an overall delay of propagation as needed depending upon the switching delays of the inverters.

The XOR gate delivers to an output node 2 a logic low signal ($\bar{A}$) when the signals applied to the respective input nodes of the XOR gate are at the same level or a logic high signal (1) when the signals applied to the input nodes are not at the same logic level.

Basically, the signal produced by the XOR gate on its output node represents one of the two control signals, the inverted replica of which may be easily derived therefrom by employing a suitable inverting stage. Most preferably however, the pair of control signals are both derived from the signal produced by the XOR gate by further employing a NAND gate between the XOR gate and the inverter INV3. In this way it becomes possible to initial the filtering circuit by means of an enable signal (START), which is applied to a second input of the NAND gate.

Therefore, the signal transfer circuit comprises a first switch connected in series with at least two series connected inverters between said input terminal and said output terminal, and wherein said feedback circuit comprises a second switch coupling said output terminal to the first of said inverters, said first switch being opened by said disconnect signal and said second switch being closed by said disconnect signal.

Also disclosed is a filtering circuit for logic signals having an input terminal to which a logic signal to be filtered is fed and an output terminal through which said logic signal free of spikes consequent to a switching of said logic signal from a state to another is delivered, which comprises a signal transfer circuit formed by a first transfer gate, driven by a pair of control signals in phase opposition to each other, functionally connected between said input terminal and an output node of a first inverter of two inverters connected in cascade between said first transfer gate and said output terminal of the circuit, and a second transfer gate, driven in phase opposition to said first transfer gate by means of the same pair of control signals, functionally connected between said output terminal and said input node of said first inverter;

a control circuit operating in a feedback mode for generating said pair of control signals essentially formed by an exclusive-OR gate having two inputs which are connected to said output terminal directly and through a delay network, respectively, and an output through which a first control signal is produced;

said pair of control signals being derived from said first control signal by means of at least one inverting stage;

said pair of control signals enabling said first transfer gate and disabling said second transfer gate until the signal present on said output terminal undergoes a change of state, whose occurrence disables said first transfer gate and enables said second transfer gate in order to maintain on said output terminal, by means of said two inverters connected in cascade, the state reached by the signal on the output terminal after said first switching for a delay time established by means of said delay network and returning at the end of said delay time said first transfer gate and said second transfer gate to an enable and a disable condition, respectively, until a new switching of said logic signal occurs.

The circuit operates as follows.

Figure 4:
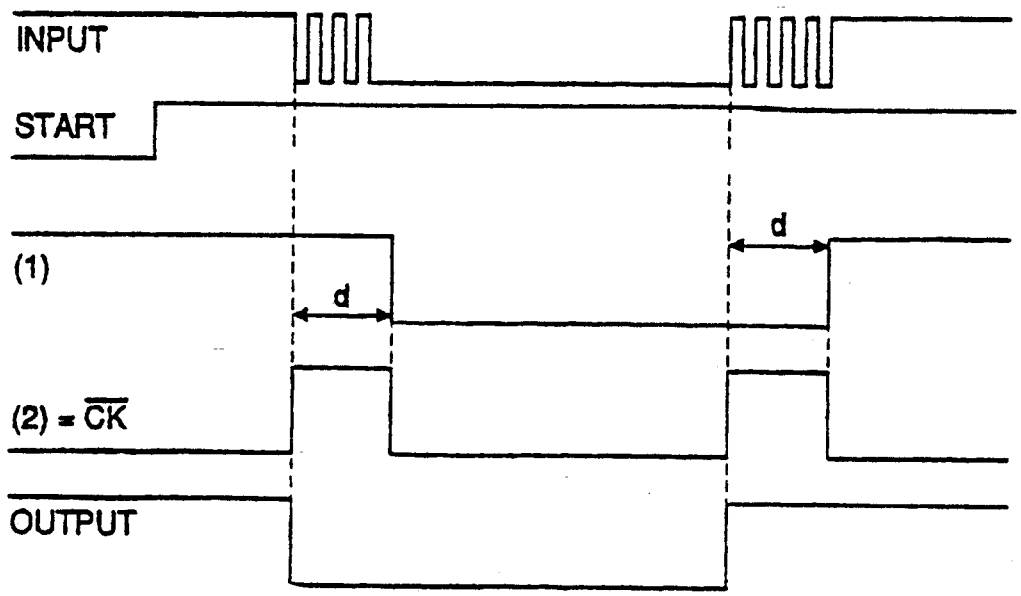
FIG. 4 are timing diagrams representative of the various signals of the circuit in FIG. 1.

The logic signal which is fed to the input terminal INPUT of the circuit is assumed to be affected by spikes, as depicted in the first timing diagram of FIG. 4. The output of the XOR gate is assumed to be $\phi$ (low) because the logic signal on the output terminal (OUTPUT) has been stable for a sufficient period of time. Also, the NAND gate is disabled by the $\phi$ (low) value signal START. The $\phi$ (low) logic levels applied to the inputs to the NAND gate causes the control signal CK to be $\phi$ (low) and of course also an inverted control signal $\overline{CK}$ to be 1 (high). Therefore, the NAND gate outputs a 1 (high) to enable the first transfer gate TG1 and connect the output terminal (OUTPUT) to the input terminal (INPUT). The NAND gate also disables the second transfer gate TG2, since it is driven in phase opposition in respect to the first transfer gate TG1. Therefore the input signal, after going through two inversions which leave it unaltered, passes to the output terminal OUTPUT.

The filter circuit is enabled by the transition of the enable signal START from $\phi$ (low) to 1 (high) thereby enabling the NAND gate. However, the output of the NAND gate is held at 1 (high) by the $\phi$ (low) at the output of the XOR gate until a transition of the input signal occurs.

When the input signal first switches (from high to low) and is coupled to the output terminal, the control circuit delay block d delays the switching of the signal on the wire 1 from high to low as depicted in the third diagram of FIG. 4. However, the high to low transition coupled to the OUTPUT terminal is immediately applied to the other input of the XOR gate.

During the delay time (d) the inputs to the XOR gate are at different logic levels, thus causing the XOR gate to output a 1 (high), as shown in the fourth timing diagram of FIG. 4. Since the NAND gate was previously enabled by the enable signal being 1 (high), the NAND gate outputs a $\phi$ (low) for the delay time (d), thereby causing the inverter INV3 to output a 1 (high) during the delay time (d) as also shown in the fourth timing diagram of FIG. 4.

Therefore for a delay time (d) after the initial transition of the output determined by the delay network d, the pair of control signals derived from said first control signal becomes: $CK=\phi$ and $\overline{CK}=1$. Therefore the transfer gate TG1 becomes an open switch while the transfer gate TG2, which is driven in phase opposition in respect to the first transfer gate, becomes a closed switch. This together with the presence of the two inverters INV1 and INV2 ensures the maintenance on the output terminal (OUTPUT) of the circuit of the logic level reached after the first transition, as shown by the relative diagram of the output signal in FIG. 4.

It is evident that the spikes which follow the first switching front, within the interval of time (d), cannot pass through to the output terminal of the filtering circuit.

At the end of the interval of time (d), which is established by the delay network d of the circuit of FIG. 1, both inputs to the XOR gate are at the same logic level, so that the XOR gate outputs a $\phi$ (low) thereby causing the NAND gate to output a 1 (high). As a result, the signal present at the input terminal is again directly transferred to the output terminal until a new switching occurs, when the cycle of generation of the pair of control signals CK and $\overline{CK}$ is repeated.

We claim:

1. A circuit for filtering spikes from a logic signal, said filtering circuit having an input terminal to which said logic signal is applied and an output terminal on which said logic signal is delivered free of spikes, said filtering circuit comprising:
   a signal transfer circuit coupling said output terminal to said input terminal; said transfer circuit decoupling said output terminal from said input terminal responsive to a disconnect signal;
   a feedback circuit, coupled between said output terminal and said signal transfer circuit, maintaining the logic level on said output terminal constant responsive to said disconnect signal; and
   a transition detector coupled to said output terminal, said transition detector generating said disconnect signal for a predetermined period after the logic level on said output terminal first transitions to a different logic level, said predetermined period being of selected duration to allow spikes to decay from said input signal within said predetermined period, said transition detector comprising:
   a delay circuit coupled to said output terminal, said delay circuit generating an output signal that changes logic levels said predetermined period after a logic signal on said output terminal changes logic levels; and
   an exclusive OR gate having a pair of inputs coupled to said output terminal and to the output of said delay circuit, said exclusive OR gate generating said disconnect signal while both inputs to said exclusive OR gate are not at the same logic level.

2. The filtering circuit of claim 1, further including means for selectively enabling said filtering circuit with an enable signal, said means comprising a gate through which said disconnect signal is coupled to said signal transfer circuit and said feedback circuit, said gate being selectively enabled by said enable signal so that said disconnect signal is not applied to said signal transfer circuit and said feedback circuit unless said gate is enabled by said enable signal.

3. The filtering circuit of claim 2 wherein said a delay circuit is a plurality of series connected inverters.

4. The filtering circuit of claim 2 wherein said a delay circuit is a resistor-capacitor network.

5. A filtering circuit for a logic signal having an input terminal to which said signal to be filtered is fed and an output terminal to which said logic signal is delivered free of spikes consequent to a switching of said logic signal from a logic level to another, which comprises:
   a signal transfer circuit formed by a first transfer gate, driven by a pair of control signals in phase opposition to each other, functionally connected between said input terminal and an input node of a first of two inverters connected in cascade between said first transfer gate and said output terminal, and a second transfer gate, driven in phase opposition to said first transfer gate by means of the same pair of control signals, functionally connected between said output terminal and said input node of said first inverter;
   a control circuit, connected to said output terminal and operating in response to the logic signal at said output terminal, said control circuit generating said pair of control signals each having a first edge coincident with the switching transition of said logic signal at said output terminal from a level to another level and a second resetting edge occurring after a preestablished delay from the occurrence of said first edge sufficiently long for said spikes to decay;
   said pair of control signals enabling said first transfer gate until the signal on said output terminal undergoes a first transition from said one level to said another level, which event causes a transition of said control signals which disable said first transfer gate and enable said second transfer gate for maintaining at the output terminal the logic level reached after said first transition for said preestablished delay before enabling again at the end of said delay time said first transfer gate and disabling again said second transfer gate until a subsequent transition of said logic signal occurs.

6. The filtering circuit of claim 5 wherein said control circuit comprises a NAND gate having a first input to which is fed a first signal, said NAND gate also having a second input to which an enabling signal is applied for initializing the circuit; the signal produced at an output of said NAND gate and fed to the input of a third inverter, together with the signal produced at the output of said third inverter constituting said pair of control signals.

7. The filtering circuit of claim 5 wherein said control circuit comprises an exclusive-OR gate having two inputs which are connected to said output terminal directly and through a delay network, respectively, the control circuit having an output though which the first of said control signal is produced.

8. The filtering circuit according to claim 7 wherein said delay network is an RC network.

9. The filtering circuit according to claim 7 wherein said delay network is formed by a chain of inverters connected in cascade.

10. A filtering circuit for logic signals having an input terminal to which a logic signal to be filtered is fed and an output terminal to which said logic signal free of spikes consequent to a switching of said logic signal from a state to another is delivered, which comprises:
   a signal transfer circuit formed by a first transfer gate, driven by a pair of control signals in phase opposition to each other, functionally connected between said input terminal and an input node of a first inverter of two inverters connected in cascade between said first transfer gate and said output terminal of the circuit, and a second transfer gate, driven in phase opposition to said first transfer gate by means of the same pair of control signals, functionally connected between said output terminal and said input node of said first inverter;

a control circuit operating in a feedback mode for generating a first one of said pair of control signals, having an exclusive-OR gate having two inputs which are connected to said output terminal directly and through a delay network, repsectively, the control circuit having an output at which said first one of said pair of control signals is produced;

a second one of said pair of control signals being derived from said first control signal by an inverting means comprising at least one inverting stage, said inverting means providing an output inverted from its input;

said pair of control signals enabling said first transfer gate and disabling said second transfer gate until signal present on said output terminal undergoes a change of state, whose occurrence disables said first transfer gate and enables said second transfer gate in order to maintain on said output terminal, by means of said two inverters connected in cascade, the state reached by the signal on the output terminal after said first switching for a delay time established by means of said delay network and returning at the end of said delay time said first transfer gate and said second transfer gate to an enable and a disable condition, respectively, until a new switching of said logic signal occurs.

11. A filtering circuit as defined in claim 10, wherein said control circuit further comprises a NAND gate having a first input receiving an output of said exclusive-OR gate, a second input to which an enabling signal is applied for initializing the circuit and an output providing said first control signal;

the signal produced at an output of said NAND gate and fed to the input of said inverting means, together with the signal produced at the output of said inverting means, constituting said pair of control signals.

12. The circuit according to claim 10, wherein said delay network is an RC network.

13. The circuit according to claim 10, wherein said delay network is formed by a chain of inverters connected in cascade.

14. A method of filtering spikes from a logic signal, comprising:

coupling said logic signal from an input terminal to an output terminal;

detecting when said output terminal transitions from one logic level to another;

decoupling said output terminal from said input terminal, when said output transitions are detected, for a period of time that is of selected duration to allow said spikes to decay from said input signal within said predetermined period; and maintaining the output terminal at the same logic level during the period of time that said output terminal is decoupled from said input terminal by feeding the signal on said output terminal through a feedback circuit back to said output terminal during the period of time that said output terminal is decoupled from said input terminal.

15. The method of claim 14 wherein said decoupling step includes:

inputting the output terminal signal to a delay circuit;

delaying the output terminal signal in said delay circuit for a predetermined period; and decoupling said output terminal from said input terminal for as long as the delay signal out of said delay circuit does not have the same logic level as the signal on said output terminal.

16. The method of claim 14 further comprising selectively enabling the feedback circuit with an enable signal such that the output terminal is not decoupled from the input terminal unless the enable signal is present.

17. A circuit for filtering spikes from a logic signal, said filtering circuit having an input terminal to which said logic signal is applied and an output terminal on which said logic signal is delivered free of spikes, said filtering circuit comprising:

a signal transfer circuit coupling said output terminal to said input terminal, having a first switch connected in series with at least one pair of inverters, said pair of inverters being connected in series between said first switch and said output terminal, for decoupling said output terminal from said input terminal responsive to a disconnect signal;

a feedback circuit coupled between said output terminal and said signal transfer circuit for maintaining a constant logic level on said output terminal responsive to said disconnect signal; and a transition detector coupled to said output terminal, said transition detector generating said disconnect signal for a predetermined period after the logic level on said output terminal first transitions to a different logic level, said predetermined period being of selected duration to allow spikes within said predetermined period to decay from said input signal.

18. The filtering circuit of claim 17 wherein said feedback circuit further includes a second switch coupling said output terminal to the input of said pair of inverters, said first switch being opened by said disconnect signal and said second switch being closed by said disconnect signal.

19. The filtering circuit of claim 17 wherein said transition detector further includes a delay circuit coupled to said output terminal, said delay circuit generating an output signal that changes logic levels at the end of said predetermined period after a logic signal on said output terminal changes logic levels; and an exclusive-OR gate having a pair of inputs coupled to said output terminal and to receive the output signal from said delay circuit, said exclusive-OR gate generating said disconnect signal while both inputs to said exclusive-OR gate are not at the same logic level.

20. The filtering circuit of claim 19 wherein the delay circuit is an RC network.

21. The filtering circuit of claim 19 wherein the delay circuit is a plurality of series connected inverters.

* * * * *